United States Patent [19]
Parent

[11] Patent Number: 5,190,738
[45] Date of Patent: Mar. 2, 1993

[54] PROCESS FOR PRODUCING UNAGGLOMERATED SINGLE CRYSTALS OF ALUMINUM NITRIDE

[75] Inventor: Luc Parent, Quebec, Canada

[73] Assignee: Alcan International Limited, Montreal, Canada

[21] Appl. No.: 716,648

[22] Filed: Jun. 17, 1991

[51] Int. Cl.$^5$ .............................................. C01B 21/072
[52] U.S. Cl. .................... 423/412; 428/539.5; 501/96
[58] Field of Search ......................................... 423/412

[56] References Cited

U.S. PATENT DOCUMENTS

| | | | |
|---|---|---|---|
| 1,094,171 | 4/1914 | Serpek | 423/412 |
| 2,962,359 | 11/1960 | Perieres et al. | 423/412 |
| 3,032,398 | 5/1962 | Clair . | |
| 3,477,812 | 11/1969 | Huml et al. | 423/412 |
| 3,607,014 | 9/1971 | Huml et al. . | |
| 3,933,573 | 1/1976 | Dugger | 423/412 |
| 4,322,395 | 3/1982 | McHenry et al. | 423/412 |
| 4,481,300 | 11/1984 | Hartnett et al. . | |
| 4,528,119 | 7/1985 | Barnes . | |
| 4,540,673 | 9/1985 | Takeda et al. . | |
| 4,615,863 | 10/1986 | Inoue et al. . | |
| 4,618,592 | 10/1986 | Kuramoto et al. . | |
| 4,650,777 | 3/1987 | Kurokawa et al. . | |
| 4,693,989 | 9/1987 | Sane . | |
| 4,806,330 | 2/1989 | Melling et al. . | |
| 4,812,425 | 3/1989 | Walker . | |
| 4,869,925 | 9/1989 | Hiai et al. . | |
| 4,908,173 | 3/1990 | Schwetz et al. . | |
| 4,977,113 | 12/1990 | Phelps et al. . | |
| 5,096,860 | 3/1992 | Nadkarni | 501/96 |

FOREIGN PATENT DOCUMENTS

| | | | |
|---|---|---|---|
| 266927 | 5/1988 | European Pat. Off. . | |
| 155210 | 7/1986 | Japan | 423/412 |
| 62-132711 | 6/1987 | Japan . | |
| 63-055108 | 3/1988 | Japan . | |
| 01-133983 | 5/1990 | Japan . | |
| 22837 | of 1913 | United Kingdom . | |

OTHER PUBLICATIONS

P. B. Perry et al, "The optical absorption edge of single-crystal AlN prepared by a close-spaced vapor process", *Appl. Phys. Lett.* 33 (4), Aug. 15, 1978, pp. 319-21.

K. M. Taylor et al, "Some Properties of Aluminum Nitride", *Journal of the Electrochemical Society* (Apr. 1960), pp. 308-314.

Hirai et al–Nippon Kinzoku Gakkaishi, 54(2), 181-5 (1990) English Abstract.

*Primary Examiner*—Wayne Langel
*Attorney, Agent, or Firm*—Cooper & Dunham

[57] ABSTRACT

A process for producing unagglomerated single crystals of aluminum nitride of low oxygen content having a size of at least 10 microns suitable for the reinforcement of metal, ceramic and polymeric matrix composite materials, and especially metal matrix materials. The process involves producing a reaction mixture of alumina (or a precursor), carbon (or a precursor), and an alkali metal oxide (or precursor such as a carbonate) as a crystal growth promoter or catalyst. The alkali metal oxide is present in an amount required for the formation of crystals of the required size, preferably in the range of 10–60 microns. The reaction mixture is subjected to a preheating step under nitrogen at a temperature in the range of 1600°–1700° and is then subjected to a heating step under nitrogen at a temperature in the range of 1800°–1950° C. This two-stage heating process ensures that the resulting crystals are of low oxygen content and thus good thermal conductivity. Particularly desirable crystals are produced if electrostatic precipitator dust is used as a source of the alumina, if petroleum coke or calcined anthracite coal is used as a source of the carbon and if the reaction is carried out in the presence of a porosity enhancer for the reaction mass, especially short cellulose fibres. The particles produced by the invention are in the form of large single crystals for good matrix reinforcement and have low oxygen and carbon contents. The invention extends to the particles produced by the process and to matrix composites reinforced with the particles.

18 Claims, No Drawings

PROCESS FOR PRODUCING UNAGGLOMERATED SINGLE CRYSTALS OF ALUMINUM NITRIDE

BACKGROUND OF THE INVENTION

I. Field of the Invention

This invention relates to a process for producing substantially unagglomerated single crystals of aluminum nitride and to the crystals so produced.

II. Description of the Prior Art

There is considerable interest nowadays in materials suitable for the reinforcement of metal, ceramic or polymeric matrix composites and similar materials. Composite materials of this type can be made to have very desirable properties, such as lightness of weight, high strength and resistance to high temperatures. Materials used for the reinforcement of the matrices must themselves have desirable properties, such as resistance to high temperatures and good resistance to attack by the matrix materials at high temperatures, as well as imparting a substantial reinforcing effect.

One material that is of interest as a matrix reinforcement is aluminum nitride. This material is especially suited for the reinforcement of aluminum matrix composites because of its high resistance to attack by molten aluminum. However, the reinforcing effect obtainable when using this material has been lower than expected because it has not been possible, at least on a commercial scale, to produce aluminum nitride in the form of particles ideally suited for reinforcement.

Aluminum nitride is used in the electronics industry, but the processes for the production of aluminum nitride for these applications generally result in the formation of sub-micron sized particles, which are too small for effective matrix reinforcement.

Most attempts to date to produce particles of aluminum nitride intended for reinforcement have resulted in polycrystalline particles which are then sintered and classified to obtain particles in the size range of at least about 10 microns. For example, individual particles can be produced by a carbothermal process for the production of aluminum nitride according to the following equation:

$$Al_2O_3 + 3C + N_2 \rightarrow 2AlN + 3CO$$

This reaction takes place at temperatures above 1700° C. but, in order to grow crystals above 10 microns in diameter, the reaction temperature must be maintained above 1800° C. However, when such temperatures are used, the product is unsatisfactory because a significant amount of carbon becomes trapped between agglomerating crystals of the AlN and the trapped carbon cannot be eliminated even by oxidation at elevated temperatures. Besides, a thick, almost sintered layer of AlN is formed on the surface of the particles, which hinders the diffusion of $N_2$ inside the particle matrix as it is being formed, thus causing incomplete reaction in the interior of the particles.

Pending U.S. Pat. application Ser. No. 07/528,878 filed on May 25, 1990 in the name of S.K. Nadkarni and assigned to the same assignee as the present application, discloses a process for producing unagglomerated single crystals of AlN of at least 10 microns in size. The process involves reacting alumina with carbon under an atmosphere of nitrogen at a temperature in the range of 1800–1950° C. in the presence of an alkali metal oxide as a crystal growth promoter or catalyst. The resulting particles are very useful for the reinforcement of composite materials, but the oxygen content of the particles can often be quite high and this reduces the thermal conductivity of the AlN, which is disadvantageous in many applications. The disclosure of this prior application is incorporated herein by reference.

OBJECTS OF THE INVENTION

An object of the invention is to produce particles of aluminum nitride of low oxygen content.

Another object of the present invention to provide a process for producing large, unagglomerated single crystals of aluminium nitride of low oxygen content which can impart an improved reinforcing effect to metal, ceramic and polymeric matrices, and to other products.

Another object of the present invention is to provide such a process capable of being operated on a commercial scale at reasonable cost.

SUMMARY OF THE INVENTION

According to one aspect of the present invention, there is provided a process for producing substantially unagglomerated single crystals of aluminum nitride of low oxygen content, which comprises subjecting alumina and carbon in the presence of nitrogen to a preheating step at a temperature in the range of 1600°–1700° C. and then to a heating step at a temperature in the range of 1800°–1950° C., in the presence of an alkali metal oxide in an amount sufficient to produce single crystals of AlN having sizes larger than about 10 microns.

The invention also relates to substantially unagglomerated single crystals of aluminum nitride of low oxygen content produced by the above process and to matrix composite materials reinforced with such single crystals of aluminum nitride.

DETAILED DESCRIPTION OF THE PRESENT INVENTION

It has been found that the matrix reinforcing effect obtainable by the use of aluminum nitride is particularly high if the aluminum nitride can be obtained in the form of large single crystals, possibly because of the high tensile strength of such crystals compared to polycrystalline particles. Ideally, the crystals should be in the size range of 10 to 100 microns in diameter, or more preferably 10 to 60 microns in diameter, for the optimum reinforcing effect, depending on the application.

In the present invention, the carbothermal reaction for the production of aluminum nitride is modified by employing an alkali metal oxide as a crystal growth (grain growth) promoter and/or catalyst. When such oxides or precursors thereof are employed, agglomeration and sintering of the AlN particles normally observed during this type of reaction is substantially prevented, even at temperatures above 1800° C. The crystals thus formed can grow as approximately spherical particles having diameters in the desired range of 10–60 microns. By preventing such agglomeration and sintering, the problem of nitrogen diffusion is also much reduced and any excess carbon can be removed from the product by oxidation.

The preferred alkali metal oxides are $Na_2O$ and $K_2O$, but $Li_2O$ and $Rb_2O$ may also be used, although the high cost of the latter two oxides would make their use on a commercial scale most probably unattractive. Instead of using the alkali metal oxides themselves, precursors which are converted to the oxides under the reaction conditions, such as alkali metal carbonates, bicarbonates, oxalates, acetates and nitrates, may alternatively be employed. Particulary preferred is $Na_2CO_3$ when the alkali metal oxide is to be $Na_2O$.

The amount of alkali metal oxide required for the reaction is any amount which produces the desired growth of single crystals of the desired size under the reaction conditions. The minimum amount of alkali metal oxide required to achieve this result is normally about 0.3 parts by weight of the alkali metal oxide (or precursor calculated as the oxide) per 100 parts by weight of alumina (or the precursor calculated as alumina). There is no particular maximum amount but, in most cases, there is no advantage to using more than about 20 parts by weight (or even more than 10 parts by weight) of the alkali metal oxide (or the precursor calculated as the oxide) for every 100 parts by weight of the alumina (or the precursor calculated as alumina) used in the reaction. A particularly preferred range is about 2 to 5 parts by weight of the alkali metal oxide per 100 parts by weight of the alumina, especially when the oxide is $Na_2O$. As the amount of alkali metal oxide is increased within the above range, larger crystals are generally formed and the percentage of small crystals in the product tends to be reduced.

The reason why the alkali metal oxides act as crystal growth promoters and/or catalysts is not precisely known and the present invention should not be bound by any particular theory. However, it is presently speculated that the alkali metal oxides first react with the alumina to form compounds of the nature $Na_2O \cdot xAl_2O_3$ (using $Na_2O$ as an example). Such compounds would have a lower free energy than both $Na_2O$ and $Al_2O_3$ and thus react with C and $N_2$ according to the reaction:

$$Na_2O \cdot xAl_2O_3 + (3x+1)C + xN_2 \rightarrow 2Na + (3x+1)CO + 2xAlN.$$

The temperature at which the free energy becomes negative for this reaction is higher than for the following reaction:

$$Al_2O_3 + 3C + N_2 \rightarrow 2AlN + 3CO$$

This means that the formation of AlN takes place at higher temperatures as the $Na_2O$ content increases. This is believed to result in the synthesis of larger crystals of AlN than those formed at lower temperatures without the alkali metal oxide. The larger crystals formed in this manner are also less likely to agglomerate and to trap carbon.

The nature of the other starting materials and reaction conditions can also be important for the production of an optimum product, and these materials and conditions are detailed below.

The reaction of our prior application mentioned above is carried out in a single heating step at a temperature in the range of 1700° C. to 1950° C., more usually 1800° C. to 1900° C. At higher temperatures there is an increasing risk of sintering the crystals and at lower temperatures large crystals tend not to be formed for the reasons given above, and also the rates of reaction are substantially lower.

A notable characteristic of AlN is its high thermal conductivity of about 280 W/m².k and the use of this material in composites can impart high thermal conductivity to the final products, particularly metal matrix composites. However, the thermal conductivity of AlN is decreased in the presence of certain impurities, one of the worst offenders in this sense being oxygen. For example, it has been found that the thermal conductivity of AlN decreases to about 80 W/m².k when the oxygen content increased by a factor of 2.5. It has now unexpectedly been found that careful control of the reaction temperature in the manner indicated below can result in the formation of AlN crystals of reduced oxygen content. Indeed, it is now apparent that the oxygen content in the interior of the AlN crystals of the present invention can often be reduced to a minimum (e.g. to 0.3% by weight) by the following heating procedure.

To achieve the desired reduction in oxygen content, the reaction mixture is first subjected to a preheating step under nitrogen at a temperature in the range of 1600°–1700° C. (preferably 1650°–1700° C.) for a period of about 1 to 4 hours, and is then subjected to a further heating step (referred to as a calcination step) under nitrogen at a temperature in the range of about 1800°–1950° C. for a second period of about 1 to 4 hours. The calcination step is preferably carried out immediately after the preheating step in the same reaction vessel and under the same atmosphere. Again without wishing to be limited to a particular theory, it is believed that the carbothermic reaction of the starting materials does not occur in a single step but in two or more different steps. In these different steps, the reaction probably produces one or more intermediary phases containing compounds such as $Al_2O$, $Al_2OC$ and $AlO_2$, etc. The use of the two distinct heating steps mentioned above is believed to optimize the formation of intermediates that help to decrease the oxygen content of the final AlN product. This feature of the invention is preferably carried out in combination with other steps which can be used to decrease the oxygen content. These other steps are explained later in the description of preferred carbon sources.

Further details of the starting materials required for the reaction of the invention are provided as follows. The reaction requires the use of alumina or a precursor thereof, carbon and/or a precursor thereof and nitrogen or a precursor thereof. Alumina itself is normally employed in the reaction, although precursors such as aluminum carbonate, oxalate, acetate, or other oxygen-containing compounds may be utilized, if desired. A particularly preferred form of alumina for the invention is ESP dust, which is an impure form of alumina obtained from electrostatic precipitators used for purifying waste gases, e.g. gases generated by alumina calciners during the production of pure alumina from bauxite. ESP dust is a well known and exists in the form of a very fine powder. Typically more than 90% by weight of the material is less than 44 microns in size. It consists of a mixture of calcined, partially calcined and uncalcined particles, and its loss on ignition (LOI) can vary between 1 and 35% by weight, but is typically less than 5%. ESP dust is highly amorphous and is further characterized by containing more than 0.3% by weight $Na_2O$, typically from 0.3 to 0.7% by weight or even up to 1% by weight or more, which can be used as the entire source of alkali metal oxide required for the present invention, or as a partial source when additional alkali metal oxide is employed.

ESP dust is the preferred form of alumina for use in the present invention because it results in the formation of a very pure unagglomerated AlN product containing a lower amount of trapped carbon material than is obtained by using commercial metallurgical grade alumina. The reason for this is not precisely known, but is may be due to the fact that ESP dust already contains an alkali metal oxide thoroughly and evenly dispersed throughout the alumina. The amorphous structure may also be more reactive than crystallized forms found in other grades of calcined alumina.

The carbon employed in the present invention is preferably carbon derived from a source selected from petroleum coke and a non-graphitizable form of hard carbon, particularly anthracite coal. Petroleum coke is a well known product available from many sources and such coke of any type from any source can be employed in the present invention. Petroleum coke is generally produced by calcining green petroleum coke, which is in turn produced by the cokifaction of the residuum resulting from the distillation of petroleum. Particularly preferred for use in the present invention is undercalcined petroleum coke produced as a by-product during the calcination of green petroleum coke. Petroleum coke contains various impurities and it is believed that these impurities affect the reaction of the present invention in ways which favour the growth of unagglomerated single crystals.

Anthracite coal is a naturally occurring source of nongraphitizable hard carbon which generally contains impurities such as Fe, Si, Al, Ca, Ti, etc. These impurities, after calcination of the anthracite, are present as carbides. It is believed that the presence of such impurities in anthracite increases its reactivity with the alumina, although the improved reactivity may also be due, at least in part, to the disordered physical structure of the anthracite (as shown by the fact that, even upon heating, the anthracite cannot be transformed into a crystalline form).

Anthracite generally contains less than about 10% by weight of volatile materials (normally 7–10%) and less than about 10% by weight of ash remaining after combustion (normally 4–10%). Anthracite is available from various mines around the world, but Pennsylvania anthracite is particularly preferred in the present invention because of the superior results which are then achieved. This anthracite is extremely dense (having a real density of more than 1.80) with porosity of less than 10%. A typical electrically calcined (1800°–2200° C.) Pa. anthracite composition in percent by weight is shown in Table 1 below:

TABLE 1

| % Si | 1.3–2.0 |
|---|---|
| % Al | 1.1–1.3 |
| % Fe | 0.3–0.6 |
| % S | 0.3 |
| % Ca | 0.05–0.20 |
| % Ash | 6–10 |
| % Carbon | Balance |

The anthracite must be calcined before use at a temperature above about 1500° C. (preferably 1600°–2200° C. and optionally about 1800° C.). The only practical way of doing this is by electrical calcination during which an electrical current is passed directly through the coal. The calcination is carried out under a non-oxidizing atmosphere (e.g. an atmosphere of Ar, a vacuum, or the atmosphere generated by the reactants themselves) for a time suitable for the removal of substantially all of the volatiles (usually a few hours). The calcined product should be allowed to cool in the same non-oxidizing atmosphere. The calcined product usually contains 90–96% by weight of carbon, with the remainder being ash. The calcination step also converts the impurities from oxides to carbides. This pre-calcination step is important although the reason for this is not completely clear.

Whichever source of carbon is used in the present invention, it is desirable to supply at least a part of the carbon requirement in the form of a carbon precursor which introduces a degree of porosity into the reaction mixture to allow for the penetration of the nitrogen or nitrogen precursor into the interior of the reaction mass. This ensures that the nitridation takes place quickly and efficiently and results in the formation of a product having a lower oxygen content than would otherwise be the case. Products of quite low oxygen content are usually produced by the process of the present invention even when a single step heating procedure is employed. Typically, the reaction is capable of producing crystals having oxygen contents below about 4% by weight, and more often about 1% by weight. By using a source of carbon capable of acting as a porosity enhancer and a two stage heating step as described above, AlN crystals having an oxygen content around 1% or less by weight can be obtained.

Carbon precursors capable of acting as porosity enhancers for use in the present invention are generally precursors having very low yields of carbon, with the remainder of the material being volatile or gasifiable at high temperatures. When such materials are heated to the reaction temperature, the volatile materials diffuse out of the reaction mass and create a system of interconnecting pores. The volatilizable portion should represent between 10 and 90% by weight of the carbon precursor for effective behaviour. The porosity enhancers are preferably used in the form of short fibres which help considerably to introduce further porosity into the reaction mass because they prevent dense packing of the starting materials and the reaction mass. The fibres should not be too long or mixing of the starting materials will be inhibited nor too short or the porosity will not be suitably enhanced by the fibres Ideally, the fibres have a length in the range of 0.5 to 5 mm and an aspect ratio (length to thickness) between 5 and 50. Cellulose fibres are the preferred porosity enhancers for use in the present invention, but fibres made of other materials, such as polystyrene, acrylics, phenolics and carbon, may be employed if desired. Normally, up to about 10% by weight of the total carbon required for the reaction is provided by the porosity enhancer. It has been found that the carbon yield of the fibre material should preferably be at least 10% to ensure that the reaction mass (or bed) does not collapse when the fibres volatilize.

The reaction of the present invention is carried out in the presence of nitrogen or a precursor, such as ammonia or an amine, which is converted to nitrogen in the reaction conditions. The atmosphere in the reaction zone may consist entirely of nitrogen or the precursor or may alternatively comprise a mixture of the nitrogen or precursor and a nonreactive gas, such as argon. Oxygen should be excluded to the extent possible to prevent oxidation of the carbon and contamination of the product with oxygen for the reasons given above. The nitrogen or precursor is normally employed at atmospheric pressure, but higher pressures or autogenous pressures may be employed, if desired. In any event, a stoichiometrical excess of nitrogen is normally provided.

The alumina and carbon may be used in relative amounts close to the stoichiometrical proportions, but the carbon is most preferably present at 5-20% excess. If an excess of carbon remains in the product, it may be removed by subjecting the product to oxidation in dry air or oxygen at a temperature of about 700° C. This temperature is high enough to oxidize the carbon but not high enough to oxidize the aluminum nitride or to increase its oxygen content significantly. Because the product is not agglomerated, the carbon is not trapped within the AlN particles, and oxidation takes place easily and completely.

The solid reactants are normally used in the form of particles having sizes below about 100 microns, and are preferably thoroughly mixed, e.g. by the use of a V-blender, in order to make the reaction mixture as homogenous as possible prior to the reaction.

The reaction, which may be carried out on a continuous or batchwise basis, is generally conducted in a closed reaction vessel, preferably having graphite walls. The reaction is generally complete after a reaction time of about 2 to 3 hours if the single heating step is employed and 2 to 8 hours if the two stage heating step is employed, after which the product is allowed to cool under the nitrogen or a non-reactive atmosphere, although oxygen may be introduced when the temperature of the product reaches about 700 C to oxidize any excess carbon, unless a graphite reactor is used, the walls of which would oxidize if oxygen were introduced at this temperature.

The AlN particles produced by the present invention are substantially unagglomerated single crystals having diameters in the range of 10-100 microns and usually 10-60 microns. The crystals are usually approximately spherical and are especially useful for matrix reinforcement. The oxygen content resulting from the two stage heating step is generally below 4% by weight, usually below 1% by weight, and may be below 0.3% in the interior of the crystals.

If necessary, the particles produced by the process can be separated further by gentle attrition. Classification to isolate crystals of 5 to 25 microns, median 15 microns, may also be desirable. The yield obtained by this is usually about 80%, illustrating that the product of the process is very largely in the desired size range. Virtually all of the product is larger than 10, or even 20, microns.

When used for matrix reinforcement in the usual way, products showing a high reinforcing effect are obtained. For metal matrices, the particles usually make up 15-20% by wt. of the total product. For ceramic matrices, they may make up to 70% by wt. The reinforcement of polymeric matrices or modification of thermal conductivity usually requires the presence of 30 to 70% by weight of the particles. Ceramic matrices reinforced with the AlN crystals of the invention have good machinability because AlN is softer than other matrix reinforcements, such as SiC.

The crystals of the invention can also be used to reinforce monolithic ceramics and preforms that are later infiltrated with molten metals. Moreover, the crystals can be used in conjunction with smaller spheres of non-metallic material to provide a bi-modal particle size distribution. Such products produce a high green packing density in a preform. They can also be used to make preforms which give controlled shrinkage on sintering, which is particularly useful for making large monolithic ceramics.

The invention is illustrated in more detail by the following non-limiting Examples and Comparative Examples.

EXAMPLE 1

A mixture of ESP dust and undercalcined coke dust in the weight proportion of 100:38 was prepared and heated under nitrogen at 1650° C. for one hour followed by calcination under nitrogen at 1850° C. for four hours. Single crystal particles having a size larger than 10 microns were produced and it was found that the oxygen content of these crystals was 2.01% by weight.

EXAMPLE 2

A mixture of ESP dust and undercalcined coke dust in the weight proportion of 100:38 was prepared and heated under nitrogen at 1650° C. for two hours followed by calcination under nitrogen at 1850° C. for four hours. The oxygen content of the resulting particles was 1.35% by weight.

EXAMPLE 3

A mixture of ESP dust and undercalcined coke dust in the weight proportion of 100:38 was prepared and heated under nitrogen at 1650° C. for four hours, followed by calcination under nitrogen at 1850° C. for four hours. The oxygen content of the resulting particles was 1.27% by weight.

Above Examples 1, 2 and 3 show that desirably low oxygen contents are obtained when a 2 hour pretreatement was carried out at 1650° C. The following two Comparative Examples show that the use pretreatment temperatures below 1650° C. or above 1700° C. result in the formation of particles of higher oxygen content.

COMPARATIVE EXAMPLE 1

A mixture of ESP dust and undercalcined coke dust in the weight proportion of 100:38 was prepared and heated under nitrogen at 1600° C. for one hour followed by calcination under nitrogen at 1850° C. for four hours. The oxygen content of the resulting particles was 2.34%.

COMPARATIVE EXAMPLE 2

A mixture of ESP dust and undercalcined coke dust in the weight proportion of 100:38 was prepared and heated under nitrogen at 1800° C. for one hour followed by calcination under nitrogen at 1850° C. for 4 hours. The oxygen content of the resulting particles was 2.41% by weight.

What is claimed is:

1. A process for producing substantially unagglomerated generally spherical single crystals of aluminum nitride having an oxygen content below about 4% by weight, which comprises subjecting alumina and carbon in the presence of nitrogen to a preheating step at a temperature in the range of 1600-1700° C. for a period of about 1 to 4 hours and then to a heating step at a temperature in the range of 1800-1950° C. for a second period of about 1 to 4 hours, in the presence of an alkali metal oxide in an amount sufficient to produce single crystals of AlN having diameters in the range of about 10 microns to about 100 microns.

2. A process according to claim 1 wherein said preheating step is carried out at a temperature of about 1650°-1700° C.

3. A process according to claim 1 wherein said alumina is derived from a precursor thereof used as a starting material.

4. A process according to claim 1 wherein said nitrogen is derived from a precursor thereof used as a starting material.

5. A process according to claim 1 wherein said alkali metal oxide is derived from a precursor thereof used as a starting material.

6. A process according to claim 1 wherein at least a portion of said carbon is derived from a precursor thereof used as a starting material.

7. A process according to claim 1 wherein said alkali metal oxide is present in an amount of 0.3 to 20 parts by weight for every 100 parts by weight of said alumina.

8. A process according to claim 1 wherein said alkali metal oxide is used in an amount of 0.3 to 10 parts by weight for every 100 parts by weight of said alumina.

9. A process according to claim 1 wherein said alkali metal oxide is sodium oxide.

10. A process according to claim 1 wherein electrostatic precipitator dust is employed as a source of said alumina.

11. A process according to claim 1 wherein said reaction is carried out in the presence of a porosity enhancer capable of increasing the porosity of the reactants to permit permeation by said nitrogen.

12. A process according to claim 11 wherein said porosity enhancer is a carbon precursor.

13. A process according to claim 12 wherein said porosity enhancer comprises cellulose fibres.

14. A process according to claim 1 wherein said carbon is carbon derived from a source selected from the group consisting of petroleum coke and calcined anthracite coal.

15. A process according to claim 3 wherein said alumina precursor is a material selected from the group consisting of aluminum carbonate, aluminum oxalate, aluminum acetate and other oxygen-containing aluminum compounds.

16. A process according to claim 4 wherein said nitrogen precursor is a material selected from the group consisting of ammonia and amines.

17. A process according to claim 5 wherein said alkali metal oxide precursor is a material selected from the group consisting of carbonates, bicarbonates, oxalates, acetates and nitrates of alkali metals.

18. A process according to claim 1 wherein said carbon is present in an amount in excess of a stoichiometrical amount relative to said alumina.

* * * * *